(12) United States Patent
Gubser et al.

(10) Patent No.: US 10,741,736 B2
(45) Date of Patent: Aug. 11, 2020

(54) COMPACT OPTO-ELECTRONIC MODULES AND FABRICATION METHODS FOR SUCH MODULES

(71) Applicant: AMS SENSORS SINGAPORE PTE. LTD., Singapore (SG)

(72) Inventors: Simon Gubser, Weesen (CH); Mario Cesana, Au (CH); Markus Rossi, Jona (CH); Hartmut Rudmann, Jona (CH)

(73) Assignee: ams Sensors Singapore Pte. Ltd., Singapore (SG)

( * ) Notice: Subject to any disclaimer, the term of this patent is extended or adjusted under 35 U.S.C. 154(b) by 0 days.

(21) Appl. No.: 15/473,935

(22) Filed: Mar. 30, 2017

(65) Prior Publication Data

US 2017/0207374 A1 Jul. 20, 2017

Related U.S. Application Data

(63) Continuation of application No. 14/917,104, filed as application No. PCT/SG2014/000390 on Aug. 20, 2014, now Pat. No. 9,640,709.

(Continued)

(51) Int. Cl.
*H01L 33/56* (2010.01)
*H01L 31/0232* (2014.01)
(Continued)

(52) U.S. Cl.
CPC ............. *H01L 33/56* (2013.01); *H01L 24/97* (2013.01); *H01L 27/14618* (2013.01);
(Continued)

(58) Field of Classification Search
CPC .............. H01L 31/186; H01L 33/0095; H01L 51/5275; H01L 51/5237; H01L 33/56;
(Continued)

(56) References Cited

U.S. PATENT DOCUMENTS 5,673,083 A * 9/1997 Izumi ................ G02B 9/12
348/335
6,351,584 B1 * 2/2002 Horie ............... G02B 6/4246
385/31

(Continued)

FOREIGN PATENT DOCUMENTS

CN 2651787 Y 10/2004
CN 1841757 A 10/2006

(Continued)

OTHER PUBLICATIONS

Australian Patent Office, International Search Report and Written Opinion, issued by ISA/AU in International Patent Application No. PCT/SG2014/000390 (dated Feb. 20, 2015).

(Continued)

*Primary Examiner* — Mohammad M Hoque
(74) *Attorney, Agent, or Firm* — Michael Best & Friedrich LLP

(57) ABSTRACT

Various optoelectronic modules are described and include one or more optoelectronic devices. Each optoelectronic module includes one or more optoelectronic devices. Sidewalls laterally surround each optoelectronic device and can be in direct contact with sides of the optoelectronic device or, in some cases, with an overmold surrounding the optoelectronic device. The sidewalls can be composed, for example, of a vacuum injected material that is non-transparent to light emitted by or detectable by the optoelectronic device. The module also includes a passive optical element. Depending on the implementation, the passive optical element can be on a cover for the module, directly on a top surface of the optoelectronic device, or on an overmold surrounding the optoelectronic device. Methods of fabricating such modules are described as well, and can facilitate manufacturing the modules using wafer-level processes.

5 Claims, 15 Drawing Sheets

Related U.S. Application Data

(60) Provisional application No. 61/903,516, filed on Nov. 13, 2013, provisional application No. 61/876,066, filed on Sep. 10, 2013.

(51) Int. Cl.

| | | |
|---|---|---|
| *H01L 27/146* | (2006.01) | |
| *H01L 23/00* | (2006.01) | |
| *H01L 31/0203* | (2014.01) | |
| *H01L 31/18* | (2006.01) | |
| *H01L 33/00* | (2010.01) | |
| *H01L 33/58* | (2010.01) | |
| *H01L 51/52* | (2006.01) | |
| *H01L 51/56* | (2006.01) | |
| *H01S 5/00* | (2006.01) | |
| *H01S 5/02* | (2006.01) | |
| *H01S 5/183* | (2006.01) | |
| *H01L 31/0216* | (2014.01) | |
| *H01L 33/44* | (2010.01) | |
| *H01L 33/48* | (2010.01) | |
| *H01L 33/54* | (2010.01) | |

(52) U.S. Cl.
CPC .. *H01L 27/14625* (2013.01); *H01L 27/14685* (2013.01); *H01L 31/0203* (2013.01); *H01L 31/02164* (2013.01); *H01L 31/02327* (2013.01); *H01L 31/186* (2013.01); *H01L 33/0095* (2013.01); *H01L 33/44* (2013.01); *H01L 33/486* (2013.01); *H01L 33/54* (2013.01); *H01L 33/58* (2013.01); *H01L 51/5237* (2013.01); *H01L 51/5275* (2013.01); *H01L 51/56* (2013.01); *H01S 5/005* (2013.01); *H01S 5/02* (2013.01); *H01S 5/183* (2013.01); *H01L 2224/16225* (2013.01); *H01L 2224/32225* (2013.01); *H01L 2224/73204* (2013.01); *H01L 2924/15311* (2013.01); *H01L 2924/181* (2013.01); *H01L 2933/005* (2013.01); *H01L 2933/0025* (2013.01); *H01L 2933/0033* (2013.01); *H01L 2933/0058* (2013.01)

(58) Field of Classification Search
CPC ......... H01L 27/14685; H01L 27/14618; H01L 27/14625; H01L 31/0203; H01L 51/56; H01L 31/02327; H01L 33/58; H01L 2933/0058; H01S 5/005; H01S 5/183; H01S 5/02

See application file for complete search history.

(56) References Cited

U.S. PATENT DOCUMENTS

| | | | |
|---|---|---|---|
| 7,329,861 | B2 | 2/2008 | Ma et al. |
| 7,408,205 | B2* | 8/2008 | Webster ............ H01L 27/14618 257/100 |
| 7,521,770 | B2* | 4/2009 | Wu ..................... H01L 31/0203 257/379 |
| 2004/0189854 | A1* | 9/2004 | Tsukamoto ............... G02B 7/02 348/340 |
| 2005/0161805 | A1* | 7/2005 | Ono .................. H01L 27/14618 257/704 |
| 2005/0163016 | A1* | 7/2005 | Kimura ................ G02B 13/001 369/112.01 |
| 2005/0242410 | A1* | 11/2005 | Groot .................. H04N 5/2253 257/433 |
| 2006/0220232 | A1* | 10/2006 | Tanida ............. H01L 27/14618 257/723 |
| 2007/0108578 | A1* | 5/2007 | Watanabe ........ H01L 27/14618 257/680 |
| 2007/0182071 | A1 | 8/2007 | Sekido et al. |
| 2008/0231693 | A1* | 9/2008 | Takayama ............ H04N 5/2257 348/65 |
| 2009/0130791 | A1 | 5/2009 | Kwon et al. |
| 2009/0134483 | A1* | 5/2009 | Weng .................. H01L 27/1462 257/432 |
| 2009/0219433 | A1* | 9/2009 | Higuchi ................. G02B 7/025 348/340 |
| 2009/0230409 | A1 | 9/2009 | Basin et al. |
| 2010/0253832 | A1 | 10/2010 | Duparre |
| 2010/0309353 | A1* | 12/2010 | Hagiwara ............ H04N 5/2253 348/294 |
| 2011/0080516 | A1* | 4/2011 | Yi ........................ H04N 5/2253 348/374 |
| 2011/0147901 | A1* | 6/2011 | Huang .................. H01L 21/565 257/660 |
| 2011/0149143 | A1 | 6/2011 | Tsujino |
| 2011/0291212 | A1* | 12/2011 | Mihara ............. H01L 27/14618 257/432 |
| 2012/0050589 | A1* | 3/2012 | Ueno ..................... H04N 9/045 348/274 |
| 2012/0091515 | A1* | 4/2012 | Yoo .................. H01L 27/14618 257/292 |
| 2012/0154673 | A1* | 6/2012 | Han ....................... G03B 17/02 348/374 |
| 2012/0218454 | A1* | 8/2012 | Suzuki .............. G02B 13/0015 348/335 |
| 2012/0274811 | A1* | 11/2012 | Bakin .................. H04N 5/2257 348/239 |
| 2013/0075587 | A1* | 3/2013 | Suzuki ............. H01L 27/14618 250/208.1 |
| 2013/0207126 | A1 | 8/2013 | Ankireddi et al. |
| 2013/0240709 | A1* | 9/2013 | Ueno ................... H01L 27/146 250/208.1 |
| 2014/0021491 | A1 | 1/2014 | Meng et al. |
| 2014/0103199 | A1 | 4/2014 | Loong et al. |
| 2014/0333822 | A1* | 11/2014 | Ha ......................... G03B 17/02 348/345 |

FOREIGN PATENT DOCUMENTS

| | | | |
|---|---|---|---|
| CN | 101286520 A | | 10/2008 |
| CN | 101587923 A | | 11/2009 |
| CN | 102103250 A | | 6/2011 |
| CN | 102299162 A | | 12/2011 |
| CN | 102540644 A | | 7/2012 |
| KR | 20120030511 A | * | 3/2012 ....... H01L 27/14614 |

OTHER PUBLICATIONS

Search Report issued in Chinese Application No. 201480049944.6, dated Nov. 30, 2016, 4 pages (with English Translation).

* cited by examiner

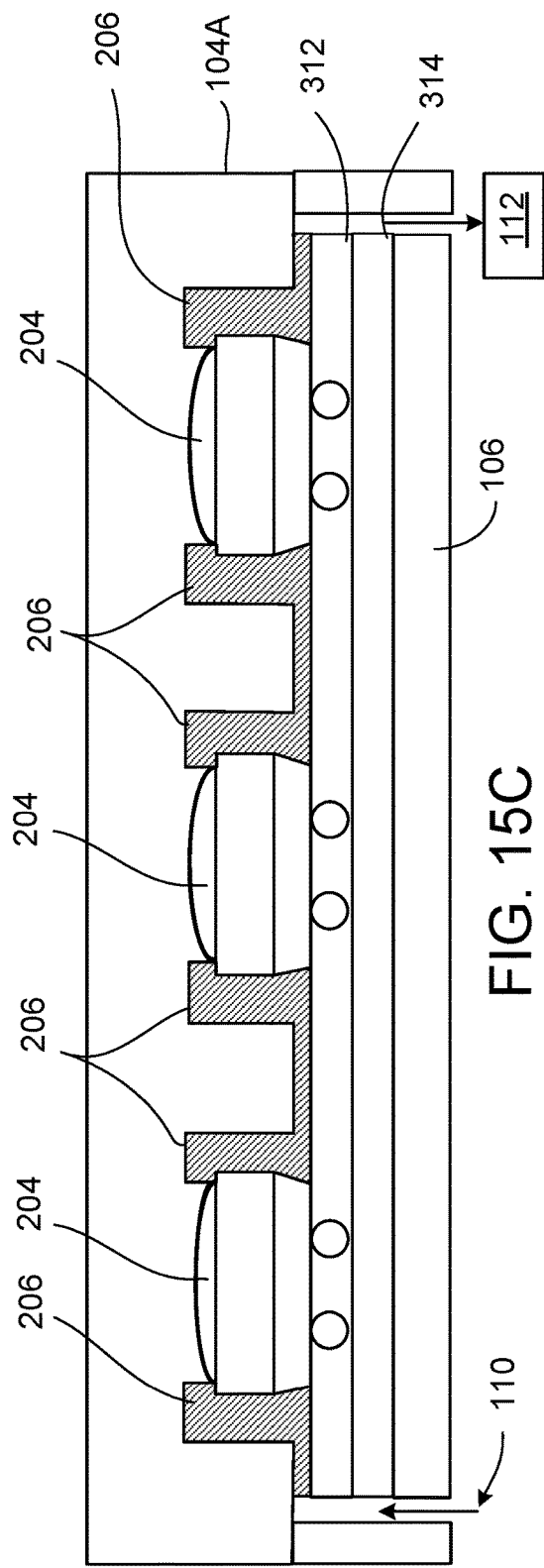
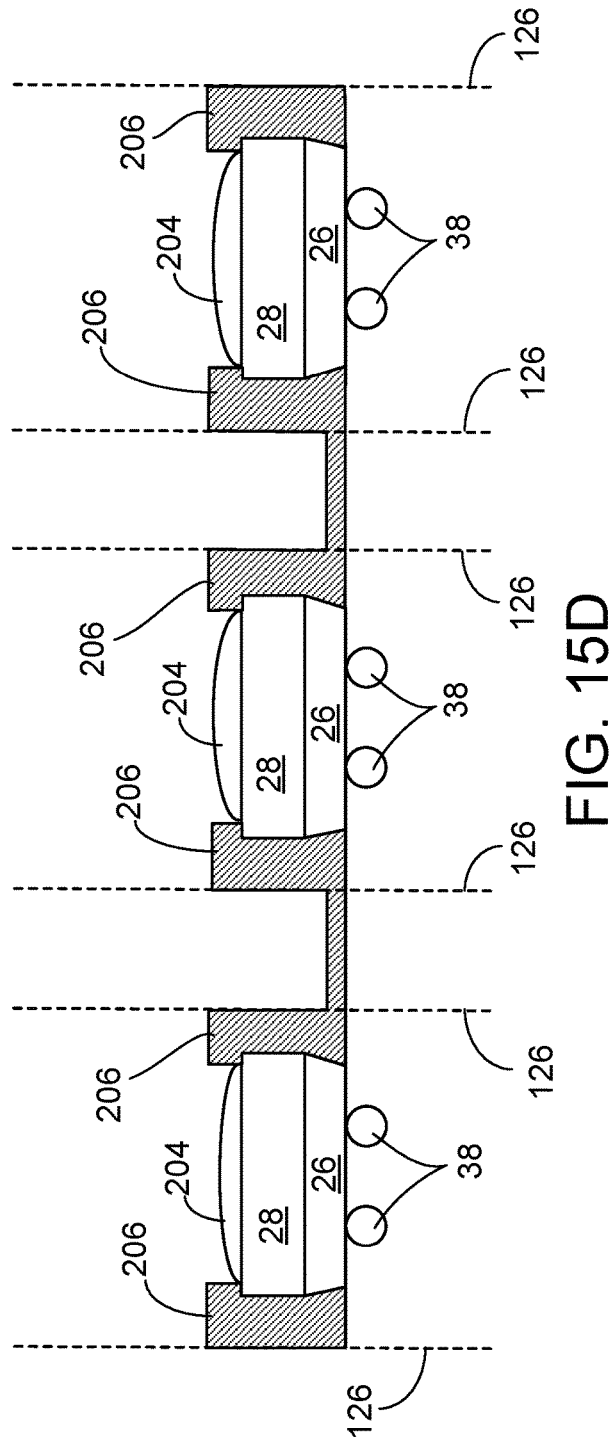

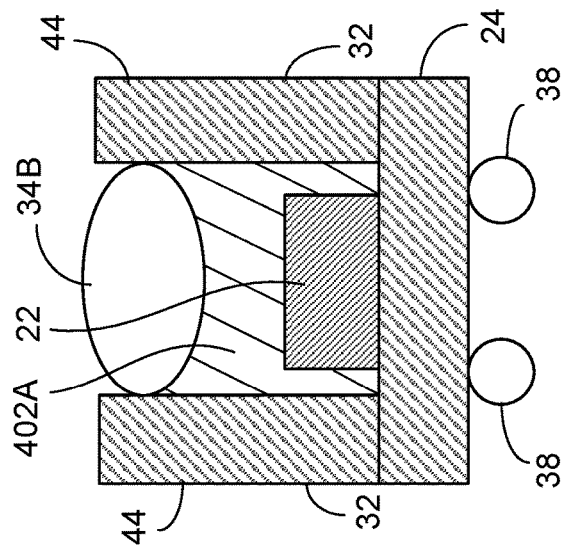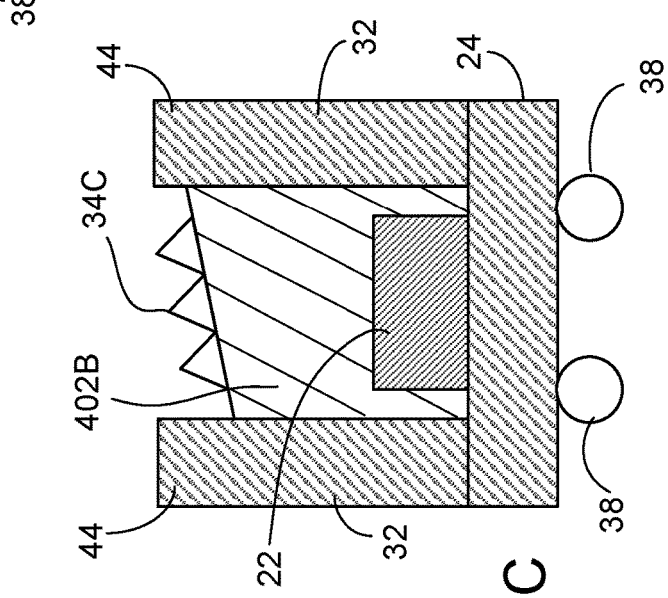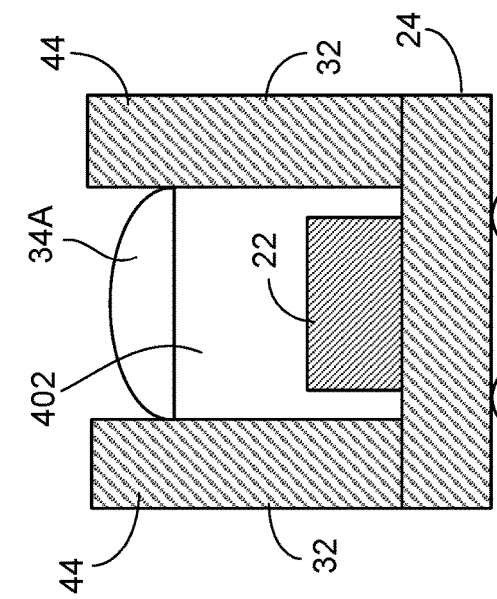
FIG. 16B
FIG. 16C
FIG. 16A

COMPACT OPTO-ELECTRONIC MODULES AND FABRICATION METHODS FOR SUCH MODULES

CROSS-REFERENCE TO RELATED APPLICATION(S)

This application is a continuation of U.S. application Ser. No. 14/917,104, filed on Mar. 7, 2016, which is the National Stage of International Application No. PCT/SG2014/000390, filed on Aug. 20, 2014, which claims the benefit of priority U.S. Application No. 61/903,516, filed on Nov. 13, 2013 and U.S. Application No. 61/876,066, filed on Sep. 10, 2013. The disclosure of the prior applications is incorporated herein by reference.

FIELD OF THE DISCLOSURE

This disclosure relates to compact optoelectronic modules and fabrication methods for such modules.

BACKGROUND

Smartphones and other devices sometimes include miniaturized optoelectronic modules such as light modules, sensors or cameras. Light modules can include a light emitting element such as a light emitting diode (LED), an infra-red (IR) LED, an organic LED (OLED), an infra-red (IR) laser or a vertical cavity surface emitting laser (VC-SEL) that emits light through a lens to outside the device. Other modules can include a light detecting element. For example, CMOS and CCD image sensors can be used in primary or front facing cameras. Likewise, proximity sensors and ambient light sensors can include a light sensing element such as a photodiode. The light emitting and light detecting modules as well as cameras can be used in various combinations. Thus, for example, a light module such as a flash module can be used in combination with a camera that has an imaging sensor. Light emitting modules in combination with light detecting modules also can be used for other applications such as gesture recognition or IR illumination.

One challenge when integrating an optoelectronic module into a device such as a smartphone is how to reduce light leakage from the light source in the light module, or how to prevent incoming stray light from impinging, for example, in the case of sensors or cameras. Although various techniques can be used to achieve these features, it can be difficult to do so in a manner than results in very compact modules, which can be particularly important for smart phones and other devices in which space is at a premium.

SUMMARY

This disclosure describes compact optoelectronic modules and fabrication methods for such modules. Each optoelectronic module includes one or more optoelectronic devices. Sidewalls laterally surround each optoelectronic device and can be in direct contact with sides of the optoelectronic device or, in some cases, with an overmold surrounding the optoelectronic device. The sidewalls can be composed, for example, of a vacuum injected material that is non-transparent to light emitted by or detectable by the optoelectronic device. The module also includes a passive optical element. Depending on the implementation, the passive optical element can be on a cover for the module, directly on a top surface of the optoelectronic device, or on an overmold surrounding the optoelectronic device.

In one aspect, for example, an optoelectronic module includes an optoelectronic device mounted on a substrate. Sidewalls of the module laterally surround the optoelectronic device and are in direct contact with sides of the optoelectronic device. The sidewalls can be composed, for example, of a vacuum injected material that is non-transparent to light emitted by or detectable by the optoelectronic device. The module also includes a transparent cover disposed over the optoelectronic device. In some implementations, the transparent cover is a passive optical element or can has a passive optical element attached to its surface.

One or more of the following features also are present in some implementations. For example, the sidewalls of the module can be composed of a UV or thermally-cured polymer material containing a non-transparent filler material. The transparent cover can be separated from the substrate by the sidewalls. In some implementations, a passive optical element (e.g., a lens) is disposed directly on an upper surface of the optoelectronic device. In such cases, the passive optical element also can serve as a cover for the module itself. In some cases, the non-transparent material that forms the sidewalls of the module is overmolded on the upper surface of the optoelectronic device. The overmolded material can define a cavity for the location of the passive optical element.

According to another aspect, an optoelectronic module includes an optoelectronic device and sidewalls laterally surrounding the optoelectronic device and in direct contact with sides of the optoelectronic device. The sidewalls can be composed of a material that is non-transparent to light emitted by or detectable by the optoelectronic device. A passive optical element is disposed on an upper surface of the optoelectronic device, and electrically conductive contacts are on an underside of the optoelectronic device and arranged to mount the module directly on a printed circuit board of a host device. Thus, the module can be arranged such that the optoelectronic device can be mounted directly onto an external printed circuit board without the need for an intervening PCB or other substrate.

In yet a further aspect, an optoelectronic module includes an optoelectronic device mounted on a substrate and a transparent overmold laterally surrounding sides of the optoelectronic device and covering a top surface of the optoelectronic device. The overmold is in direct contact with the optoelectronic device. The module further includes a passive optical element on a top surface of the overmold, and sidewalls laterally surrounding the optoelectronic device and in direct contact with sides of the overmold. Such implementations can be useful, for example, where the optoelectronic device itself does not include a transparent cover. Further, the top surface of the overmold can be shaped to accommodate variously-shaped lenses or other passive optical elements, or to act, for example, as a prism.

Methods of fabricating the modules also are described. Such methods can include wafer-level fabrication techniques that allow multiple optoelectronic modules to be made at the same time. In some implementations, the methods include one or more replication and/or vacuum injection tools to form various features of the modules.

In some implementations, the modules can be made relatively compact, with a relatively small footprint and/or a small overall height. Such small, compact modules can be particularly advantageous for mobile phones and other devices in which space is at a premium.

Other aspects, features and advantages will be readily apparent from the following detailed description, the accompanying drawings and the claims.

BRIEF DESCRIPTION OF THE DRAWINGS

FIGS. 15A-15D illustrate a wafer-level method of fabricating multiple optoelectronic modules as shown in FIG. 14.

FIGS. 16A-16C illustrate further examples of optoelectronic modules in accordance with the invention.

DETAILED DESCRIPTION

Figure 1:
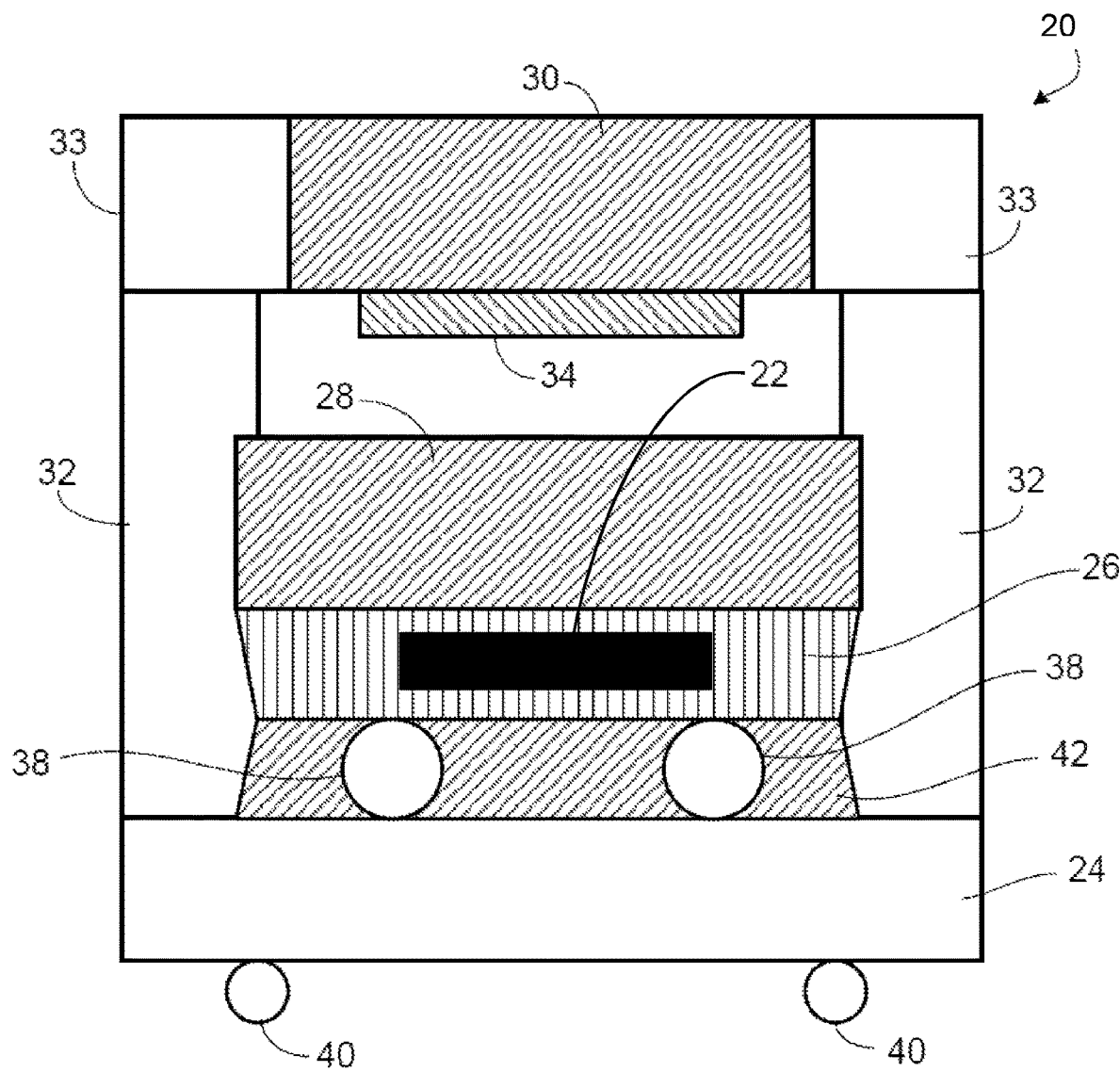
FIG. 1 illustrates a cross-sectional view of an example of an optoelectronic module in accordance with the invention.

The present disclosure describes various compact optoelectronic modules that include non-transparent spacers which serve as sidewalls for the module. An example of such a module is illustrated in FIG. 1, which shows a module 20 including an optoelectronic device 22 mounted on a printed circuit board (PCB) or other substrate 24. Examples of the optoelectronic device 22 include a light emitting element (e.g., a LED, an IR LED, an OLED, an IR laser or a VCSEL) or a light detecting element (e.g., a photodiode or other light sensor). The light emitting or light detecting element can be embedded in or formed on, for example, a semiconductor substrate 26, which also can include other circuit elements (e.g., transistors, resistors, capacitive and inductive elements) and can be protected by a transparent device cover (e.g., a cover glass) 28 over the top of the semiconductor substrate 26.

A transparent module cover 30 composed, for example, of glass, sapphire or a polymer material, is separated from the substrate 24 by a spacer 32. The transparent module cover 30 generally is transparent to wavelengths of light emitted or detectable by the optoelectronic device 22, although it may be surrounded at its sides by non-transparent material 33. The spacer 32 preferably is composed of a non-transparent material, which surrounds the optoelectronic device 22 laterally and serves as sidewalls for the module 20. As illustrated in FIG. 1, the spacer 32 is in direct contact with the sides of the optoelectronic device 22, which can result in a highly compact module with a relatively small footprint.

In some implementations, attached to one side of the transparent module cover 30 is an optical element such as a lens or diffuser 34. In the illustrated example of FIG. 1, the optical element 34 is present in an interior area of the module 20. In some implementations, the optical element 34 is formed on the transparent module cover 30 by a replication technique (e.g., such as etching, embossing or molding). In other implementations, a molded optical element (e.g., a lens) can be fixed in a frame composed of non-transparent material or can be replicated into such a frame. The frame then can be attached to the spacer 32.

The optoelectronic device 22 can be mounted to the PCB substrate 24 using flip chip technology. For example, the underside of the device 22 can include one or more solder balls or other conductive contacts 38 that electrically couple the optoelectronic device 22 to conductive pads on the surface of the PCB substrate 24. To provide further stability, the area between the bottom surface of the optoelectronic device 22 and the top surface of the PCB substrate 24 can be filled with an adhesive underfill 42. The PCB substrate 24, in turn, can include plated conductive vias that extend from the conductive pads vertically through the substrate 24 and that are coupled to one or more solder balls or other conductive contacts 40 on the exterior side of the substrate 24. The conductive contacts 40 allow the module 20 to be mounted, for example, on a printed circuit board in a handheld device such as a mobile phone, tablet or other consumer electronic device.

The foregoing module can be made relatively compact, with a relatively small footprint. For example, in some implementations, the overall dimensions of the module 20 of FIG. 1, can be about 2.0 mm (length)×2.3 mm (width)×1.3 mm (height). Such small, compact modules can be particularly advantageous for mobile phones and other devices in which space is at a premium.

Modules such as the one illustrated in FIG. 1 and described above can be fabricated, for example, in a wafer-level process such that multiple modules 20 can be fabricated at the same time. Generally, a wafer refers to a substantially disk- or plate-like shaped item, its extension in one direction (y-direction or vertical direction) is small with respect to its extension in the other two directions (x- and z- or lateral directions). On a (non-blank) wafer, multiple similar structures or items can be arranged, or provided therein, for example, on a rectangular or other shaped grid. A wafer can have openings or holes, and in some cases a wafer may be free of material in a predominant portion of its lateral area. In some implementations, the diameter of the wafer is between 5 cm and 40 cm, and can be, for example, between 10 cm and 31 cm. The wafer may be cylindrical with a diameter, for example, of 2, 4, 6, 8, or 12 inches, one inch being about 2.54 cm. The wafer thickness can be, for example, between 0.2 mm and 10 mm, and in some cases, is between 0.4 mm and 6 mm. In some implementations of a wafer level process, there can be provisions for at least ten modules in each lateral direction, and in some cases at least thirty or even fifty or more modules in each lateral direction.

Figure 2:
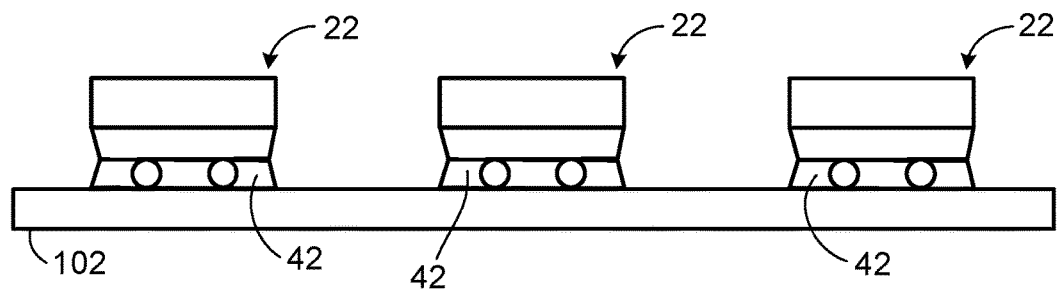
FIGS. 2-6 illustrate a wafer-level method for fabricating multiple optoelectronic modules at the same time.
Figure 3:
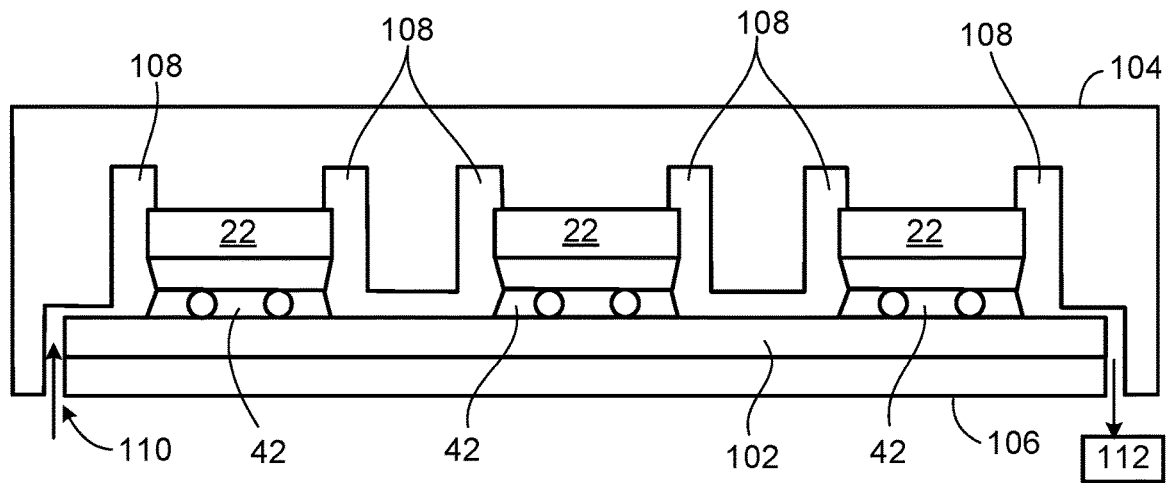
Figure 4:
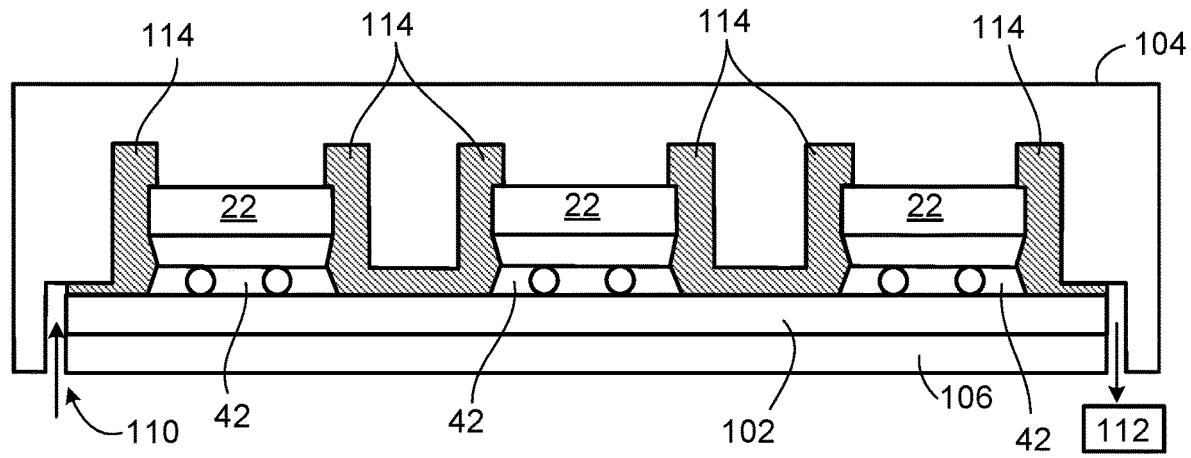

FIGS. 2 through 6 illustrate an example of a wafer-level process for fabricating modules such as the module 20 of FIG. 1. As shown in FIG. 2, multiple optoelectronic devices 22 are mounted on a PCB or other support wafer 102. In some implementations, an array of devices 22 is mounted (e.g., by pick-and-place equipment) on the PCB wafer 102. An adhesive underfill 42 can be used to attach the devices 22 to the PCB wafer 102. Next, as shown in FIG. 3, a vacuum injection PDMS tool 104 is placed over the devices 22 and the PCB wafer 102. A vacuum chuck 106 is provided below and around the PCB wafer 102 so as to apply a vacuum between the vacuum injection tool 104 and the PCB wafer 102.

Figure 5:
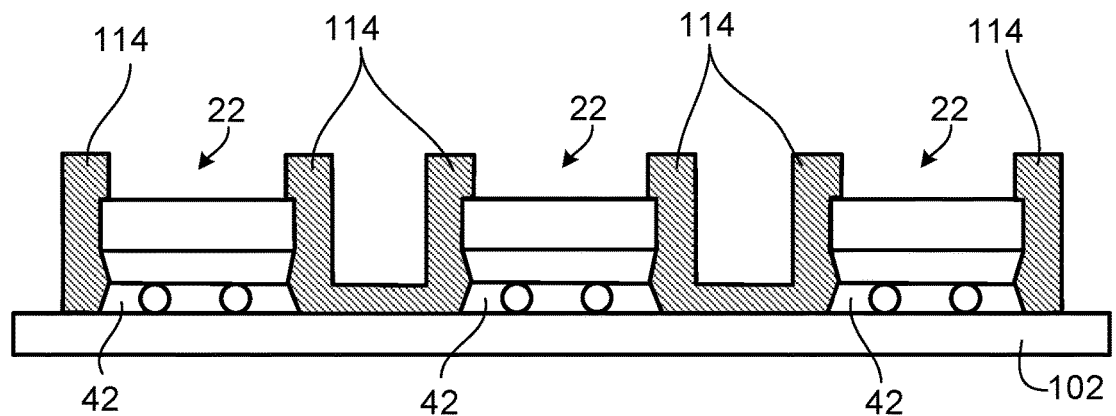

As shown in the example of FIG. 3, the vacuum injection tool 104 has spaces 108 that surround each device 22 laterally. Preferably, the spaces 108 extend slightly higher than the top of the devices 22. Non-transparent material 114 can be injected under vacuum through an inlet 110 in the vacuum chuck 106 so that it fills the spaces 108 (see FIG. 4). A vacuum pump 112 near an outlet of the vacuum chuck 106 facilitates flow of the injected material. The non-transparent material can be composed, for example, of a flowable polymer material (e.g., epoxy, acrylate, polyurethane, or silicone) containing a non-transparent filler (e.g., carbon black, a pigment, an inorganic filler, or a dye). The non-transparent material 114 subsequently is hardened (e.g., by UV or thermal curing). The tool 104 and vacuum chuck then can be removed. The result, as shown in FIG. 5, is that non-transparent walls 114 are formed laterally about the sides of each device 22. The non-transparent walls 114 are in direct contact with the sides of each device 22. Furthermore, the non-transparent walls 114 extend vertically from the upper surface of the PCB wafer 102 to a point somewhat higher than the top of the devices 22.

Figure 6:
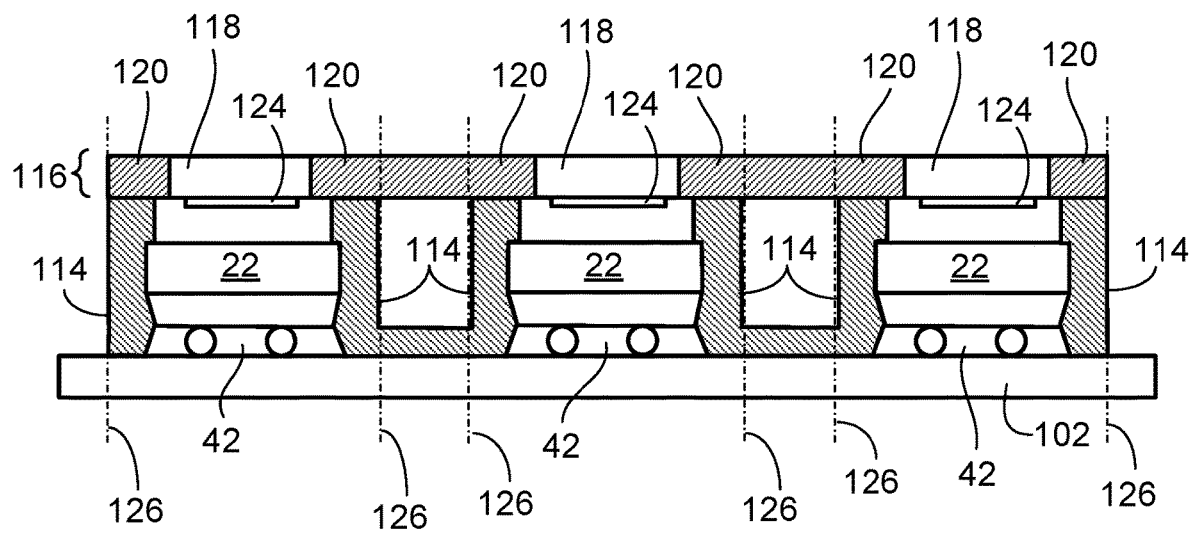

Next, as illustrated in FIG. 6, an optics wafer 116 (sometime referred to as a cover wafer) is attached to the top of the walls 114 such that the optics wafer 116 is substantially parallel to the PCB wafer 102. The result is a wafer stack. The walls 114 thus serve as spacers that separate the PCB wafer 102 from the optics wafer 116.

The optics wafer 116 can be composed, for example, of a PCB material such as G10 or FR4 (which are grade designations assigned to glass-reinforced epoxy laminate materials) with openings that are filled with transmissive material (e.g., glass or plastic). The optics wafer 116 thus has optically transmissive regions 118 separated from one another by non-transparent regions 120. Each optically transmissive region 118 is disposed directly over a corresponding one of the optoelectronic devices 22 and serves as a transparent window for incoming or outgoing light of a particular wavelength or range of wavelengths (i.e., light emitted by or detectable by the device 22). In some implementations, the width (or diameter) of each transmissive region 118 is slightly smaller than the corresponding width (or diameter) of the devices 22. In addition, in some implementations, a passive optical element (e.g., a lens) 124 is disposed on the device-side surface of each transmissive region 118. The lenses 124 can be formed on the transmissive regions 118, for example, by a replication technique prior to attaching the optics wafer 116 to the spacer walls 114. In yet other implementations, a passive optical element (e.g., a lens) can be replicated directly into a hole in a non-transparent wafer, which is attached to the spacer 32. In that case, the lens itself also would serve as a transparent cover for the module.

After attaching the optics wafer 116 to the spacer walls 114 as described above, the wafer stack can be separated (e.g., by dicing) along lines 126 into multiple modules such as the module 20 of FIG. 1.

In the foregoing fabrication process, the passive optical elements (e.g., lenses 124 in FIG. 6) are formed on an optics wafer 116, which is subsequently attached to the injection molded non-transparent material 114 to form a wafer stack. In other implementations, the passive optical elements (e.g., lenses) can be formed as part of a wafer-level process that does not require a separate optics wafer as described above. Instead, as explained in greater detail below, the passive optical elements for the modules are replicated directly on the transparent cover 28 of each device 22. An example of such a process is described below in connection with FIGS. 7-11.

Figure 7:
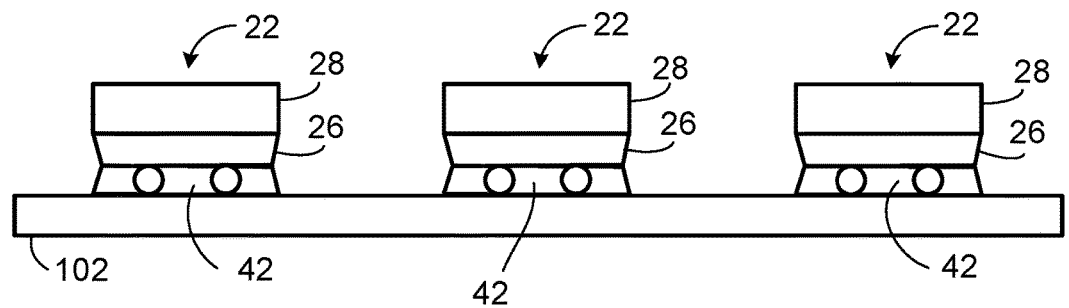
FIGS. 7-11 illustrate a second wafer-level method of fabricating multiple optoelectronic modules.
Figure 8:
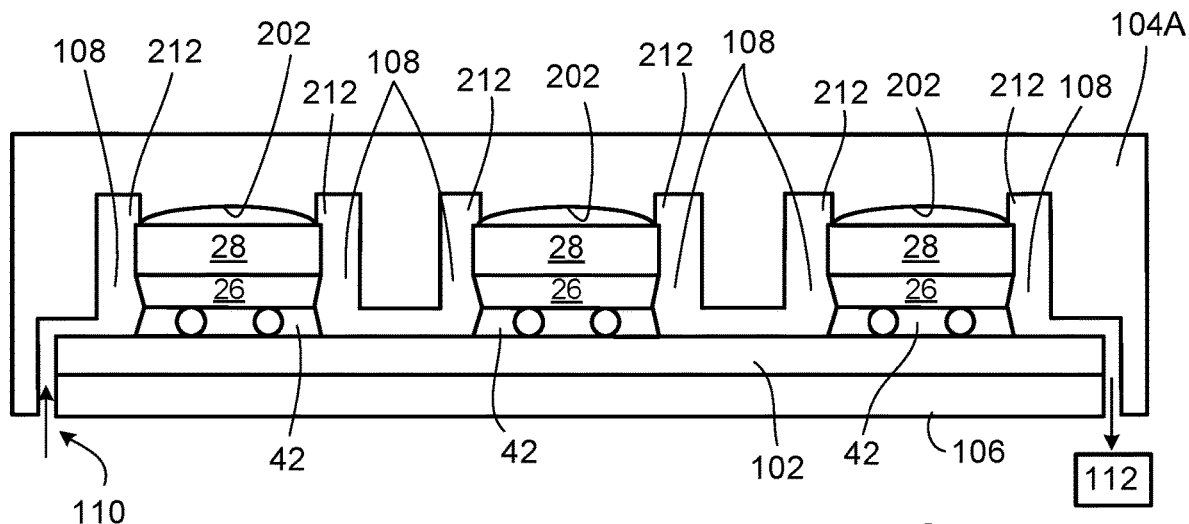
Figure 9:
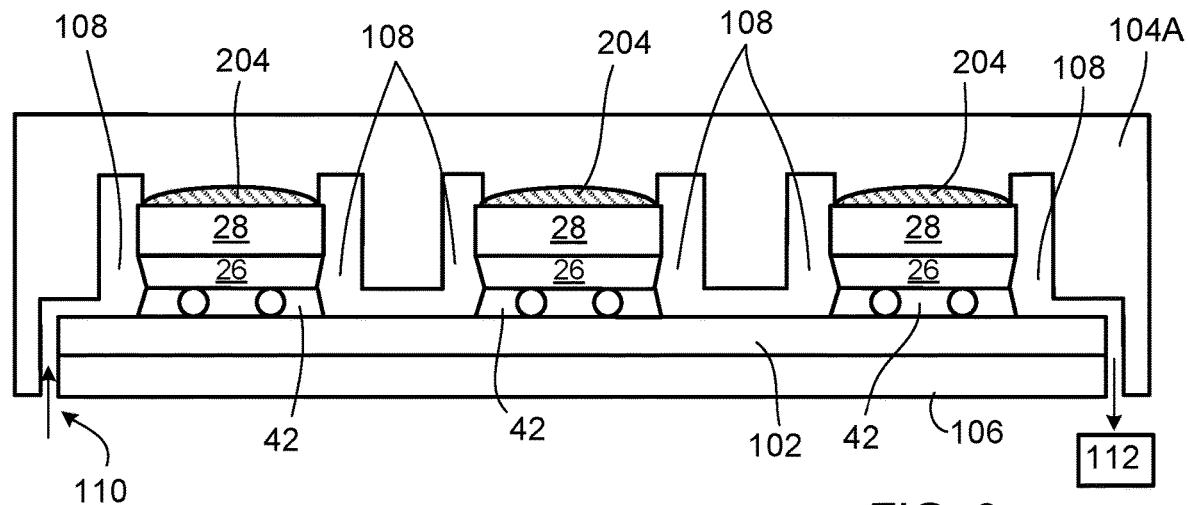

As shown in FIG. 7, multiple optoelectronic devices 22 are mounted on a PCB or other support wafer 102. In some implementations, an array of devices 22 is mounted (e.g., by pick-and-place equipment) on the PCB wafer 102. An adhesive underfill 42 can be used to attach the devices 22 to the PCB wafer 102. Next, as shown in FIG. 8, a combined replication and vacuum injection tool 104A is placed over the devices 22 and the PCB wafer 102. A vacuum chuck 106 is provided below and around the PCB wafer 102 so as to apply a vacuum between the tool 104A and the PCB wafer 102.

As shown in the example of FIG. 8, the replication and vacuum injection tool 104A has spaces 108 that surround each device 22 laterally and that subsequently are filled, by vacuum injection, with a non-transparent material. In some implementations, the spaces 108 extend slightly higher than the top of the devices 22, although in other implementations the spaces 108 may be substantially flush with the top surface of the transparent device cover 28. In addition to the spaces 108 for the vacuum injected material, the tool 104A has optical element replication sections 202 shaped to correspond to the shape of optical elements (e.g., lenses) that will be formed on the top surface of the devices 22.

To form the replicated optical elements, a replication material (e.g., a liquid, viscous or plastically deformable material) is placed onto the optical replication sections 202, and the top surfaces of the transparent device covers 28 are brought into contact with the tool 104A so that the replication material is pressed between the top surface of each transparent device cover 28 and the optical element replication sections 202. The replication material then is hardened (e.g., by UV or thermal curing) to form replicated optical elements 204 (e.g., lenses) on the surface of the transparent device covers 28 (see FIG. 9).

Figure 10:
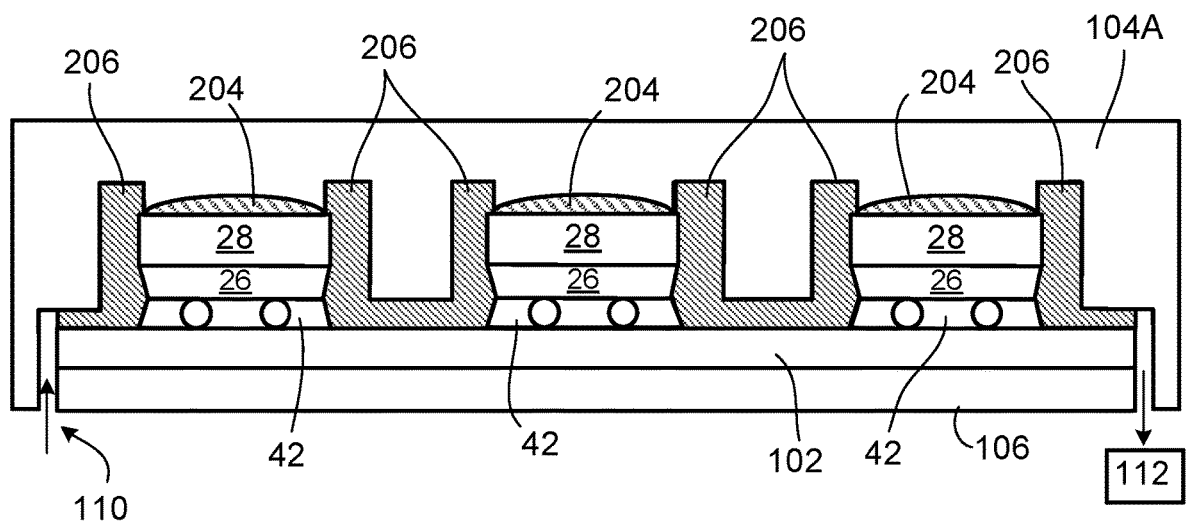
Figure 11:
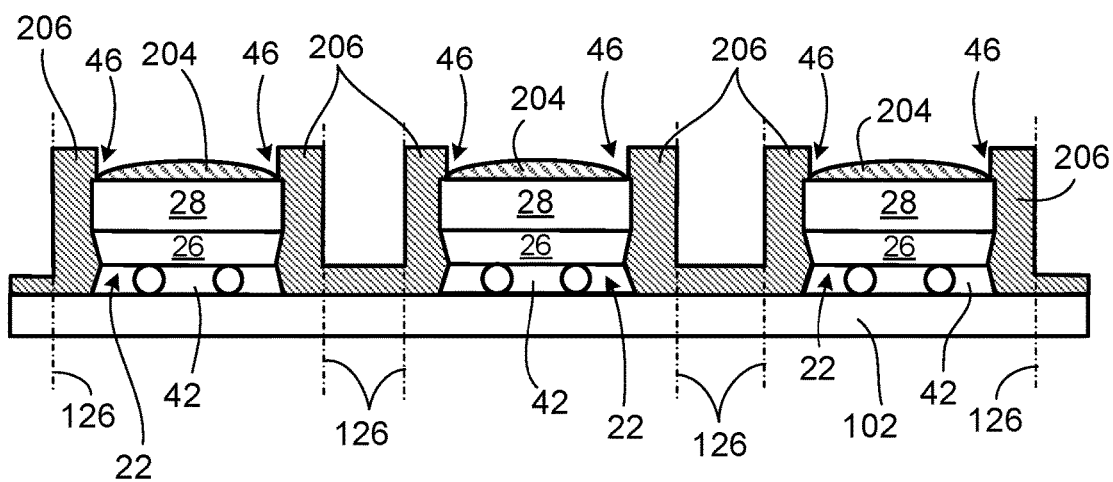

Next, non-transparent material can be injected under vacuum through an inlet 110 in the vacuum chuck 106 so that it fills the spaces 108 (see FIG. 10). A vacuum pump 112 near an outlet of the vacuum chuck 106 facilitates flow of the injected material. The non-transparent material can be composed, for example, of a flowable polymer material (e.g., epoxy, acrylate, polyurethane, or silicone) containing a non-transparent filler (e.g., a pigment, inorganic filler, or dye). The non-transparent material subsequently is hardened (e.g., by UV or thermal curing). The combined replication and vacuum injection tool 104A and vacuum chuck then can be removed. The result, as shown in FIG. 11, is that non-transparent walls 206 are formed laterally about the sides of each device 22. Here too, the non-transparent walls 206 are in direct contact with the sides of each device 22. Furthermore, the non-transparent walls 206 extend vertically from the upper surface of the PCB wafer 102 to a point somewhat higher than the top of the devices 22 so as to encircle each lens 204 laterally.

Figure 12:
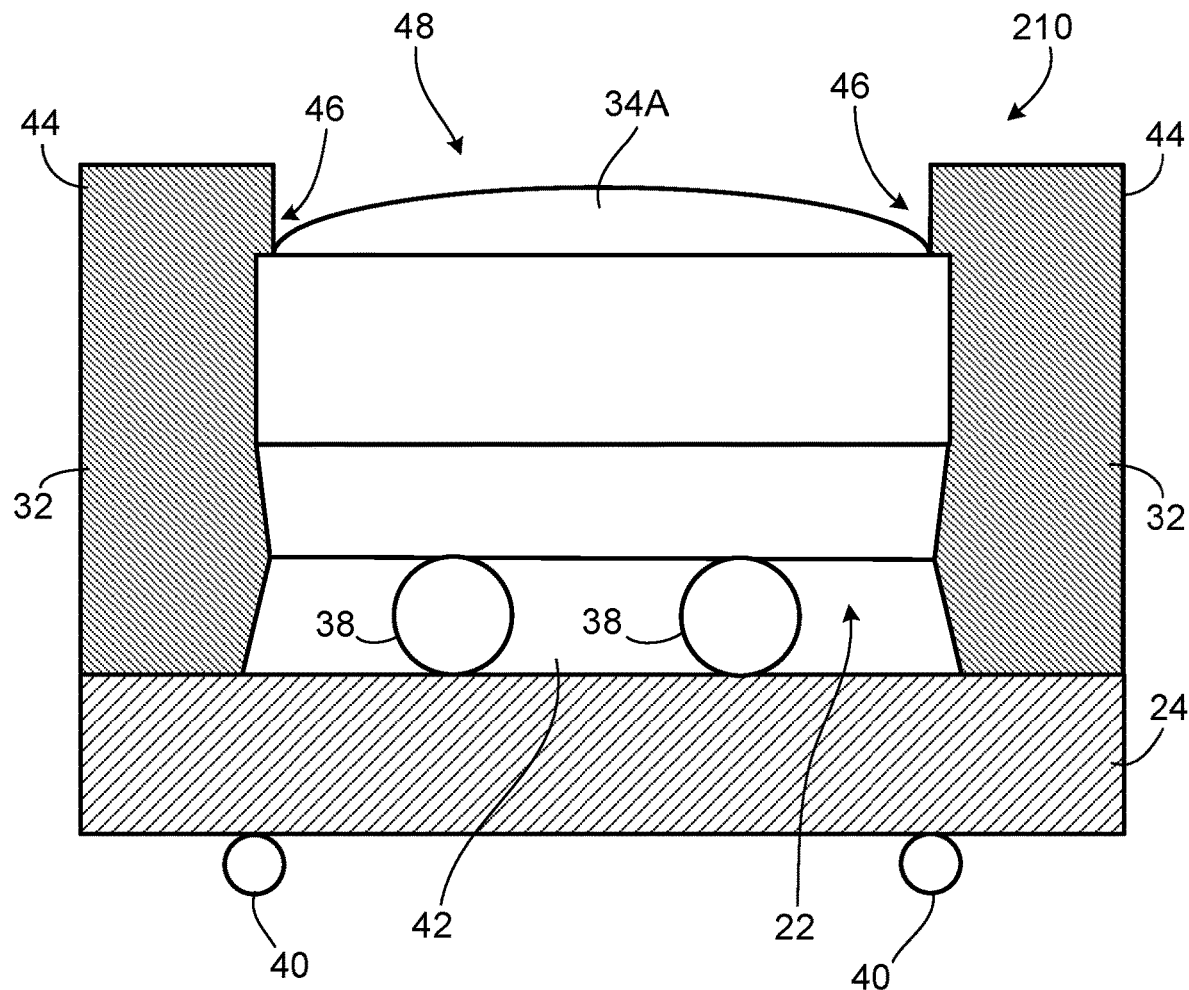
FIG. 12 illustrates a cross-sectional view of another example of an optoelectronic module in accordance with the invention.

The mounted devices 22 then can be separated (e.g., by dicing) along lines 126 into multiple modules such as the module 210 of FIG. 12. The module 210 is similar to the module 20 of FIG. 1. However, instead of an optical element (e.g., lens) 34 on the surface of a transparent module cover 30 as in FIG. 1, the module 210 of FIG. 12 includes a passive optical element (e.g., lens) 34A that is directly on the upper surface of the device 22 (i.e., on the upper surface of the transparent device cover 28). Thus, in this example, the optical element 34A also serves as a transparent cover for the module. The arrangement of the module 210 of FIG. 12 allows its dimensions (e.g., the height) to be made even smaller, in some cases, than the module 20 of FIG. 1. As in the module 20 of FIG. 1, the non-transparent sidewalls 32 of the module 210 of FIG. 12 laterally surround the device 22 and are in direct contact with the sides of the device 22. Furthermore, in the illustrated example, the sidewalls 32 can extend somewhat above the top of the device 22 (i.e., above the top surface of the transparent cover 28) so as to encircle the replicated lens 34A and to provide a non-transparent baffle 44 for the module. The height of the baffle 44 can be adjusted, if needed, by changing the height of the vertical spaces 108 in the tool 104A (see, e.g., FIG. 8).

Figure 13:
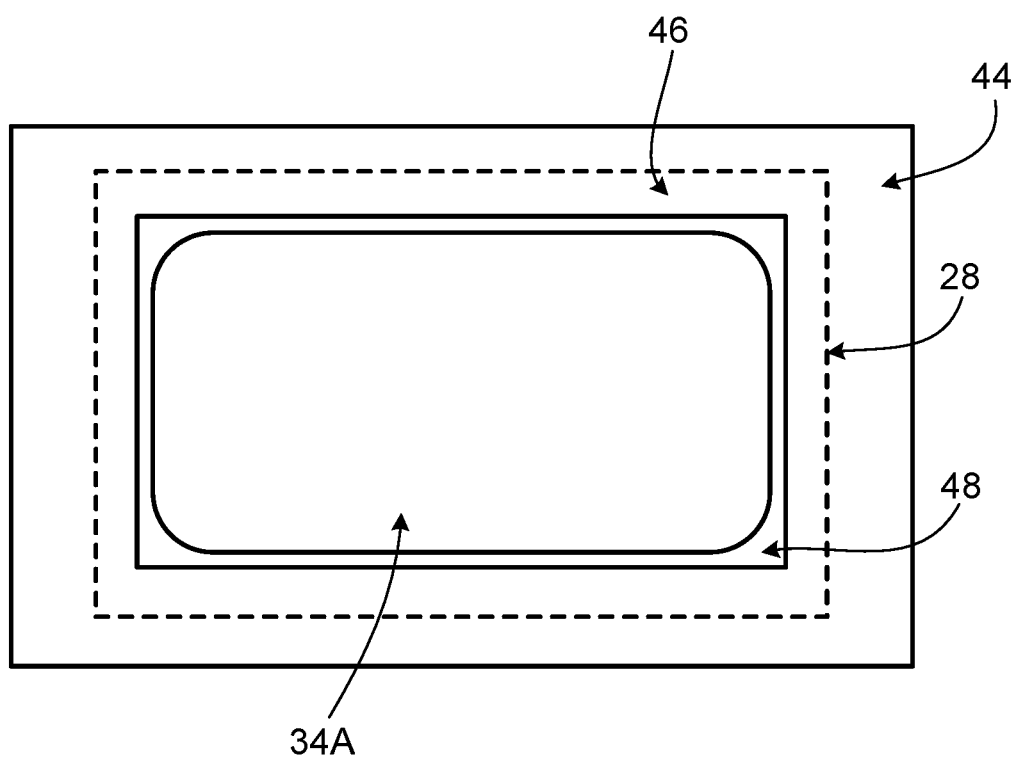
FIG. 13 is a top view of optoelectronic module of FIG. 12.

As described in the foregoing example of FIGS. 7-11, the same tool 104A is used to form the replicated lenses 204 and to provide the vacuum injected sidewalls 206. In other implementations, different tools can be used to perform the replication and vacuum injection processes. For example, a first vacuum injection tool can be used to form the non-transparent walls 206 as described above and then a second replication tool can be used to form the optical elements 204. In such situations, it can be useful to overmold the vacuum injected non-transparent material slightly onto the top of the transparent device cover 28 at its edges. The overmolded section 46 (see FIGS. 12 and 13) at the edges of the transparent device cover 28 can define a cavity 48 to facilitate formation of the lens 34A in the proper location during the subsequent replication process. The upper portion 212 of the spaces 108 in the tool 104A can be shaped to obtain the overmolded section 46 during the vacuum injection process (see, e.g., FIGS. 8-11).

The foregoing module can be made relatively compact, with a relatively small footprint. For example, in some implementations, the overall dimensions of the module 210 of FIG. 12 can be about 2.0 mm (length)×2.3 mm (width)×1.0 mm (height). Such small, compact modules can be particularly advantageous for mobile phones and other devices in which space is at a premium.

Figure 14:
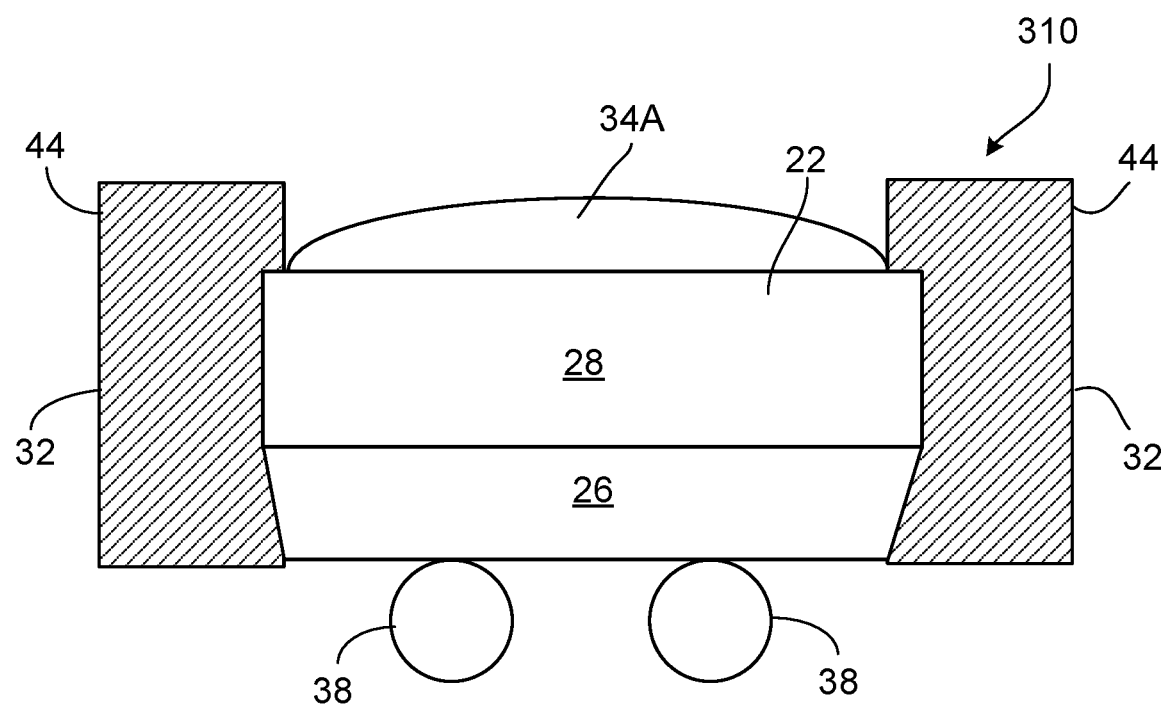
FIG. 14 is a cross-sectional view of a further example of an optoelectronic module in accordance with the invention.

In the modules of the foregoing examples (e.g., FIGS. 1 and 12), the optoelectronic device 22 is mounted to a PCB or other substrate 24. The substrate 24 includes conductive contacts such as solder balls 40 on its underside to facilitate mounting the module on a printed circuit board. Thus, in the examples of FIGS. 1 and 12, the PCB substrate 24 forms part of the module. Other implementations, however, are possible in which the finished module does not include a PCB or other substrate 24. Instead, the module can be fabricated such that the optoelectronic device 22 can be mounted directly on a printed circuit board that is not part of the module itself. An example of such a module 310 is illustrated in FIG. 14. By omitting the PCB or other substrate 24, the overall height of the module can be reduced even further.

The module of FIG. 14 can be fabricated, for example, using a sacrificial substrate on which the optoelectronic devices are mounted. Following formation of the passive optical elements 34A on the upper surface of the optoelectronic devices 22 and formation of the walls 32, the sacrificial substrate can be removed. An example of such a process is illustrated in FIGS. 15A-15D.

Figure 15A:
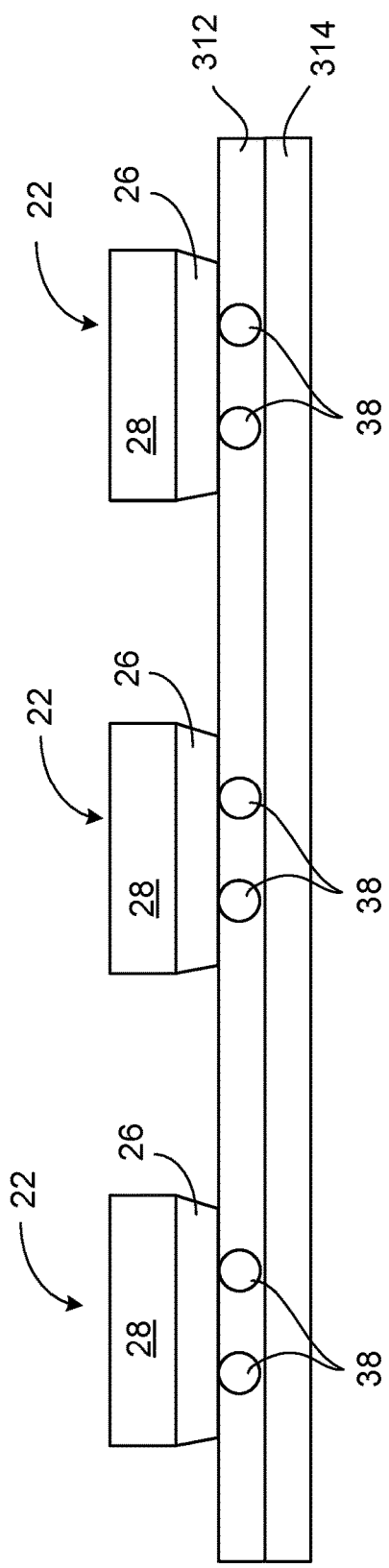
Figure 15B:
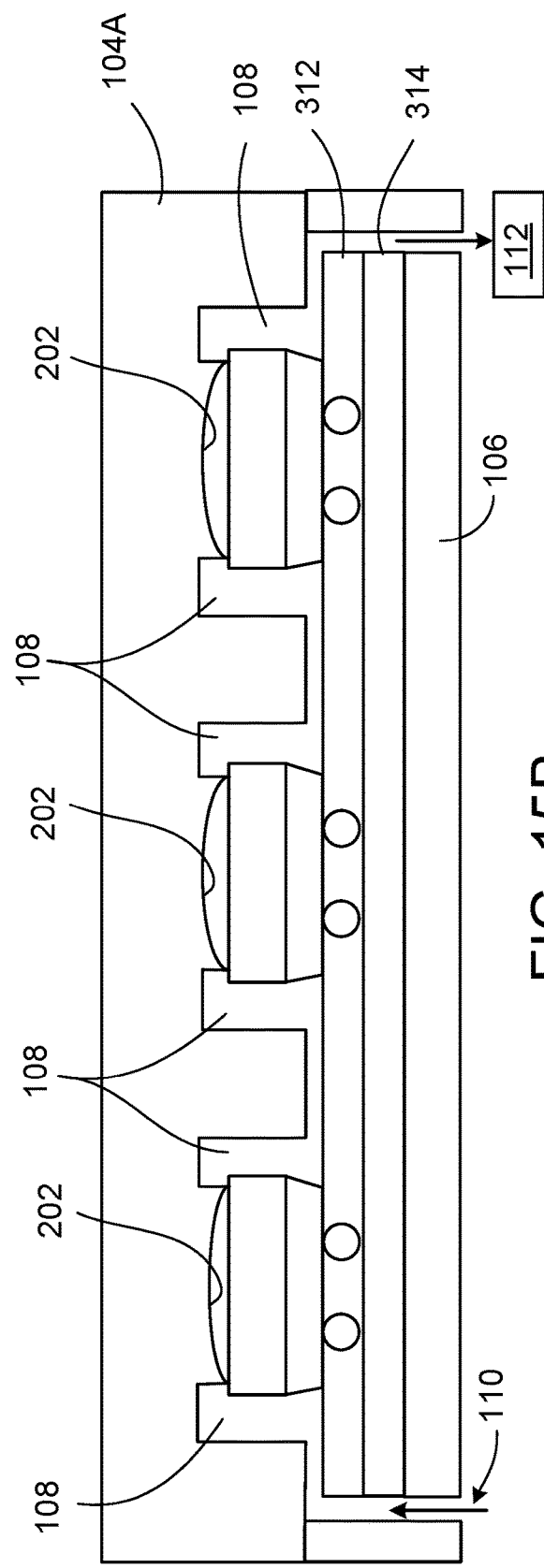

As shown in FIG. 15A, multiple optoelectronic devices 22 are placed on a sacrificial support 312, which in turn may be supported, for example, by a more rigid tape 314. The sacrificial support 312 can be composed, for example, of a soft adhesive material (e.g., PDMS or a polymer foam) such that the solder balls 38 of the optoelectronic devices 22 are at least partially embedded in the sacrificial support 312. In other implementations, the solder balls 38 can be embedded in a thick film photoresist or a dry resist, which serves as the sacrificial support 312. In some implementations, an array of devices 22 is mounted (e.g., by pick-and-place equipment) on the sacrificial support 312. Next, as shown in FIG. 15B, a combined replication and vacuum injection tool 104A is placed over and around the devices 22. A vacuum chuck 106 is provided below and around the rigid support tape 314 so as to apply a vacuum between the tool 104A and the support tape 314. As the PDMS tool 104A and vacuum chuck 106 are applied, the solder balls 38 along the bottom surface of the optoelectronic devices 22 are pressed into the soft material of the sacrificial support 312.

An optical element 204 (e.g., lens) can be replicated on the top surface of each optoelectronic device 22 in a manner similar to that described above in connection with FIGS. 8-9. Thus, to form the replicated optical elements, a replication material (e.g., a liquid, viscous or plastically deformable material) is placed onto the optical replication sections 202 of the tool 104A, and the top surfaces of the transparent device covers 28 are brought into contact with the tool 104A so that the replication material is pressed between the top surface of each transparent device cover 28 and the optical element replication sections 202. The replication material then is hardened (e.g., by UV or thermal curing) to form replicated optical elements 204 (e.g., lenses) on the surface of the transparent device covers 28 (see FIG. 15C).

In addition, non-transparent walls 206 can be formed around each optoelectronic device 22 in a manner similar to that described above in connection with FIG. 10. Thus, non-transparent material can be injected under vacuum through an inlet 110 in the vacuum chuck 106 so that it fills the spaces 108 (see FIGS. 15B and 15C). A vacuum pump 112 near an outlet of the vacuum chuck 106 facilitates flow of the injected material. The non-transparent material can be composed, for example, of a flowable polymer material (e.g., epoxy, acrylate, polyurethane, or silicone) containing a non-transparent filler (e.g., a pigment, inorganic filler, or dye). The non-transparent material subsequently is hardened (e.g., by UV or thermal curing).

The combined replication and vacuum injection tool 104A and the vacuum chuck 106 then can be removed. In addition, the modules can be separated from the sacrificial support 312, and the devices 22 can be separated from one another (e.g., by dicing) along lines 126 (see FIG. 15D). If the sacrificial support 312 is composed of a soft adhesive, the modules can be picked up individually, for example, by vacuum suction. On the other hand, if the sacrificial support 312 is composed of a thick film photoresist or a dry film resist, the resist can be removed, for example, by applying UV radiation. In some implementations, the devices 22 can be separated from one another (e.g., by dicing) prior to removing the sacrificial support 312. The result is that non-transparent walls 206 are formed laterally about the sides of each device 22. Here too, the non-transparent walls 206 are in direct contact with the sides and bottom of each optoelectronic device 22. As illustrated in FIG. 14, the same vacuum injected non-transparent material forms the sidewalls 32 of the module 310 and are in direct contact with the sides of the optoelectronic device 22. Thus, the vacuum injected non-transparent material effectively serves as a housing for the optoelectronic device 22. Furthermore, in the illustrated example, the non-transparent walls 206 extend vertically from the upper surface of the PCB wafer 102 to a point somewhat higher than the top of the device 22 so as to encircle the lens 204 laterally, thereby providing a baffle. In some implementations, the vacuum injected non-transparent material can be overmolded slightly onto the top of the transparent device cover 28 at its edges as described above in connection with FIGS. 12 and 13.

By forming the lens 34A directly on the top surface of the optoelectronic device 22 and by forming the module such that the solder balls 38 for the optoelectronic device 22 can be mounted directly onto an external printed circuit board without the need for an intervening PCB or other substrate, a highly compact module 310 can be obtained. In particular, the module 310 can have a relatively small overall height.

In the foregoing implementations of FIGS. 12 and 14, the passive optical element (e.g., lens) 34A is formed directly on the upper surface of the optoelectronic device 22 (e.g., on the transparent cover 28). In some implementations, however, it can be advantageous to form a transparent overmold 402 over the optoelectronic device 22 and then subsequently form the optical element 34A on the surface of the overmold 402 (see FIG. 16A). The overmold 402, which can be composed, for example, of a curable polymer such as epoxy, thus protects the optoelectronic device 22 and serves as a support for the lens or other passive optical element 34A. Such implementations can be useful, for example, where the optoelectronic device 22 itself does not include a transparent cover 28. Further, use of the overmold can obviate the need for a separate optics wafer during fabrication of the module (e.g., optics wafer 116 in FIG. 6). The top surface of the overmold 402 can be shaped for variously-shaped lenses or other passive optical elements. For example, FIG. 16B illustrates an example in which the lens-side surface of the overmold 402A is shaped so as to conform to the shape of the lens 34B. The overmold 402 and lens 34B can be composed of the same or different materials. For example, the overmold 402 can be composed of a material having a first index of refraction, and the lens 34B can be composed of a second material having a higher index of refraction. In some implementations, such as shown in FIG. 16C, the surface of the overmold 402B on which a passive optical microstructure 34C is formed can be slanted (e.g., shaped like a prism). Implementations like the one of FIG. 16C can facilitate introducing light deflection and/or beam shaping. Here too the optical microstructure can be composed of the same or different material as the overmold 402B. Thus, providing a transparent overmold to encapsulate the optoelectronic device 22 can facilitate incorporating any of a wide range of passive optical elements into the module.

Figure 17A:
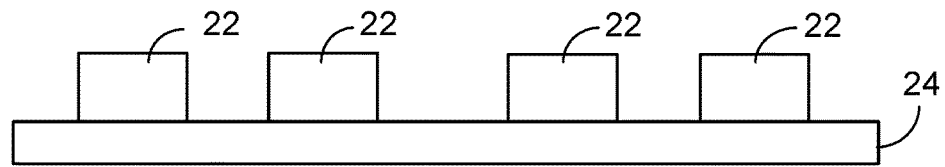
FIGS. 17A-17G illustrate a wafer-level method of fabricating multiple optoelectronic modules as shown in FIGS. 16A-16C.
Figure 17B:
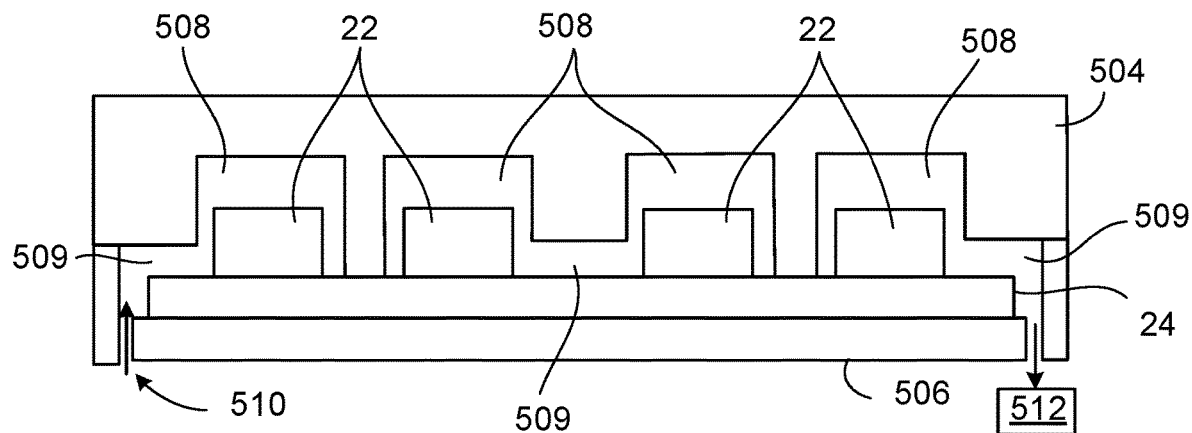
Figure 17C:
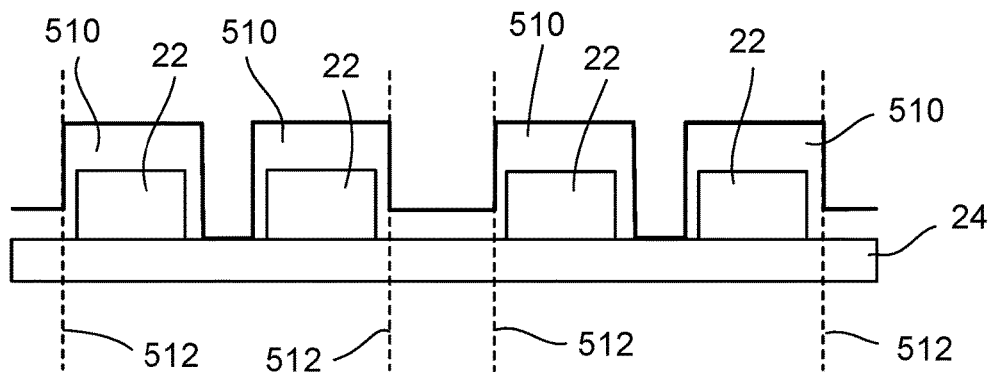
Figure 17D:
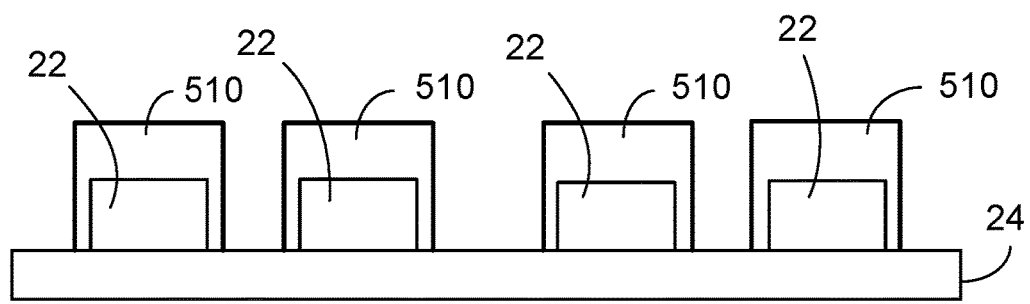
Figure 17E:
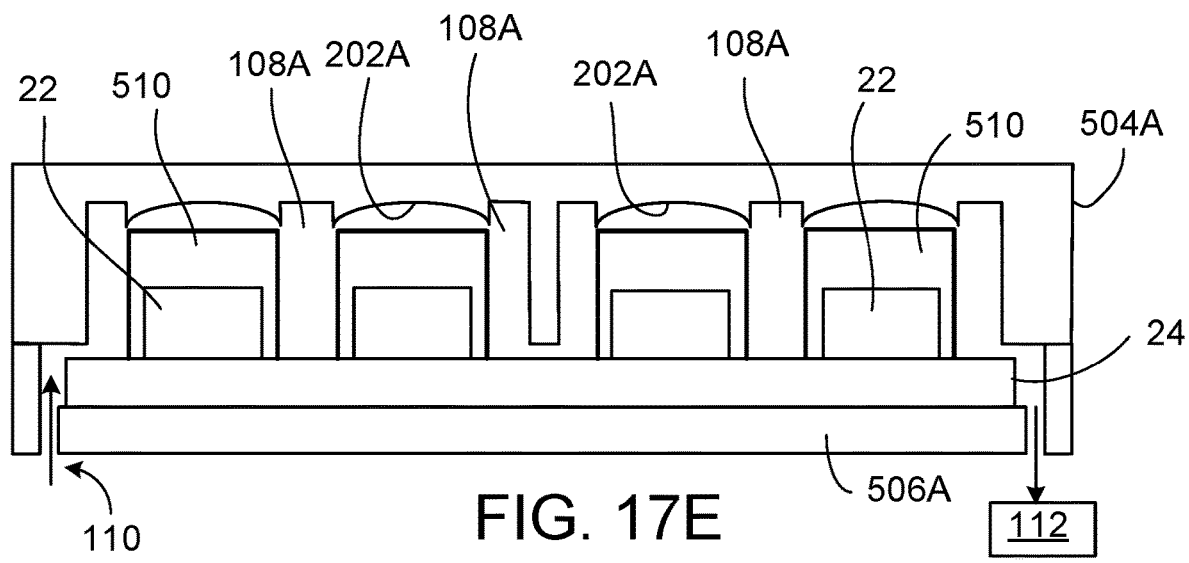
Figure 17F:
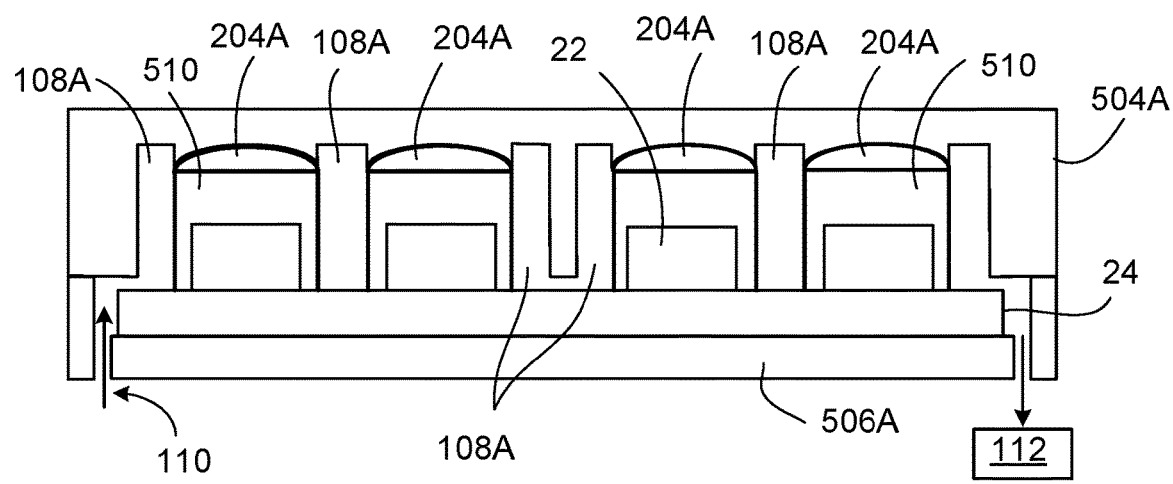

The modules of FIGS. 16A-16C can be fabricated, for example, as part of a wafer-level process in which multiple modules are manufactured at the same time. An example of such a process is illustrated in FIGS. 17A-17G. For example, as illustrated in FIG. 17A, multiple optoelectronic devices (e.g., light emitting or light detecting devices) are mounted on a PCB or other substrate 24. In some implementations, an array of devices 22 is mounted (e.g., by pick-and-place equipment) on the substrate 24. Next, as shown in FIG. 17B, a first PDMS vacuum injection tool 504 is placed over and around the devices 22. A vacuum chuck 506 is provided below and around the substrate 24 so as to apply a vacuum between the first tool 504 and the substrate 24. Next, a transparent material (e.g., an epoxy) is injected under vacuum through an inlet 110 in the vacuum chuck 506 so that it fills spaces 508, whose shape (when viewed from above) can be rectangular, circular or some other shape depending on the implementation. Injection channels 509, as well as a vacuum pump 112 near an outlet of the vacuum chuck 506, facilitate flow of the injected material. The transparent material in the spaces 508 subsequently is hardened (e.g., by UV or thermal curing) to form transparent overmold regions 510 (see FIG. 17C). To obtain overmold regions having a curved upper surface as in FIG. 16B or a slanted upper surface as in FIG. 16C, the shape of the spaces 508 defined by the first tool 504 can be modified appropriately. Following formation of the overmold regions 510 by vacuum injection, the first tool 504 and the vacuum chuck 506 are removed (see FIG. 17C), and the regions corresponding to the vacuum channels 509 are removed by dicing along lines 512. The resulting structure is shown in FIG. 17D.

In some cases, instead of forming an overmold 510 over each device 22 using the vacuum injection technique described in connection with FIGS. 17A-17D, an overmold can be formed over each device 22 by encapsulating the devices in a transparent material using a screen printing process. For example, a PCB substrate 24, on which are mounted light emitting or light detecting devices 22, can be placed in a screen printer. Transparent encapsulation material then is provided by a print screen process so as to encapsulate each device 22. After curing the encapsulation material, the screen is released and removed, resulting in multiple encapsulated devices 22. A PCB wafer 24, including overmolded or encapsulated devices 22, then can be used, for example, in the process of FIGS. 17E-17G, described below.

An optical element 204A (e.g., lens) can be replicated on the top surface of each overmold region 510 in a manner similar to that described above in connection with FIGS. 8 and 9. Thus, to form the replicated optical elements, a replication material (e.g., a liquid, viscous or plastically deformable material) is placed onto the optical replication sections 202A of a second combined replication and vacuum injection tool 504A. See FIG. 17A. The top surfaces of the overmold regions 510 are brought into contact with the second tool 504A so that the replication material is pressed between the top surface of each overmold region 510 and a corresponding optical element replication section 202A. The replication material then is hardened (e.g., by UV or thermal curing) to form replicated optical elements 204A (e.g., lenses) on the surface of the overmold regions 510 (see FIG. 17F). To form optical elements having a different shape (e.g., such as 34B in FIG. 16B or 34C in FIG. 16C), the shape of the optical element replication sections 204A can be modified appropriately.

In addition, non-transparent walls 206A can be formed in a manner similar to that described above in connection with FIG. 10. Thus, non-transparent material can be injected under vacuum through the inlet 110 in the vacuum chuck 506A so that it fills the spaces 108A (see FIG. 17G) surrounding the overmold regions 510. The vacuum pump 112 near the outlet of the vacuum chuck 506A facilitates flow of the injected material. The non-transparent material can be composed, for example, of a flowable polymer material (e.g., epoxy, acrylate, polyurethane, or silicone) containing a non-transparent filler (e.g., a pigment, inorganic filler, or dye). The non-transparent material subsequently is hardened (e.g., by UV or thermal curing).

Figure 17G:
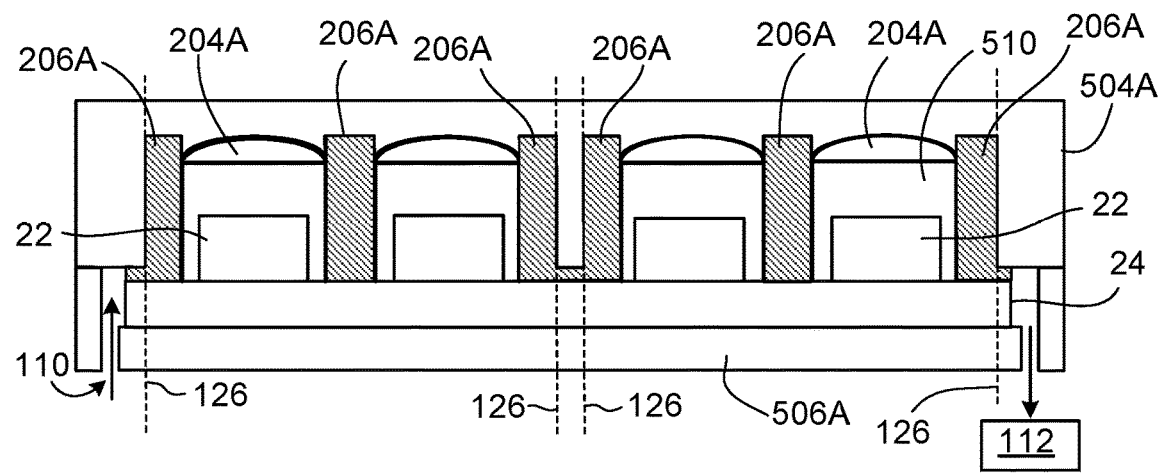

The second tool 504A and the vacuum chuck 506A then can be removed, and the devices 22 can be separated (e.g., by dicing) along lines 126 (see FIG. 17G). In contrast to the implementations of FIGS. 1, 12 and 14, the non-transparent walls 206A are not in direct contact with the sides of each optoelectronic devices 22. Instead, the non-transparent walls 206A are in direct contact, respectively, with the sides of the overmold regions 510.

Figure 18A:
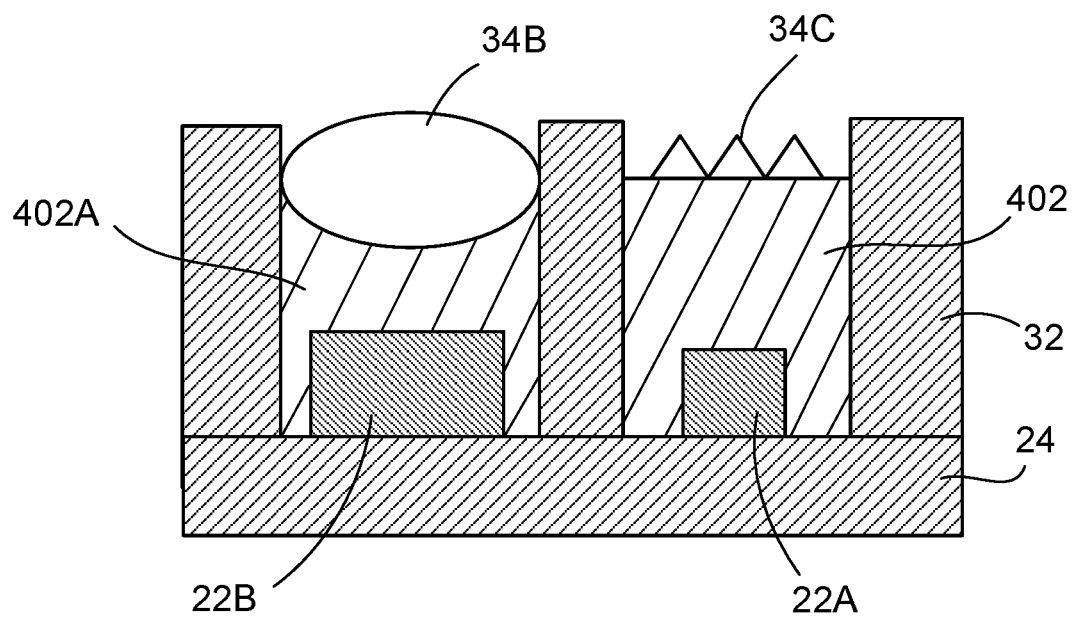
FIGS. 18A and 18B illustrate additional examples of modules according to the invention.
Figure 18B:
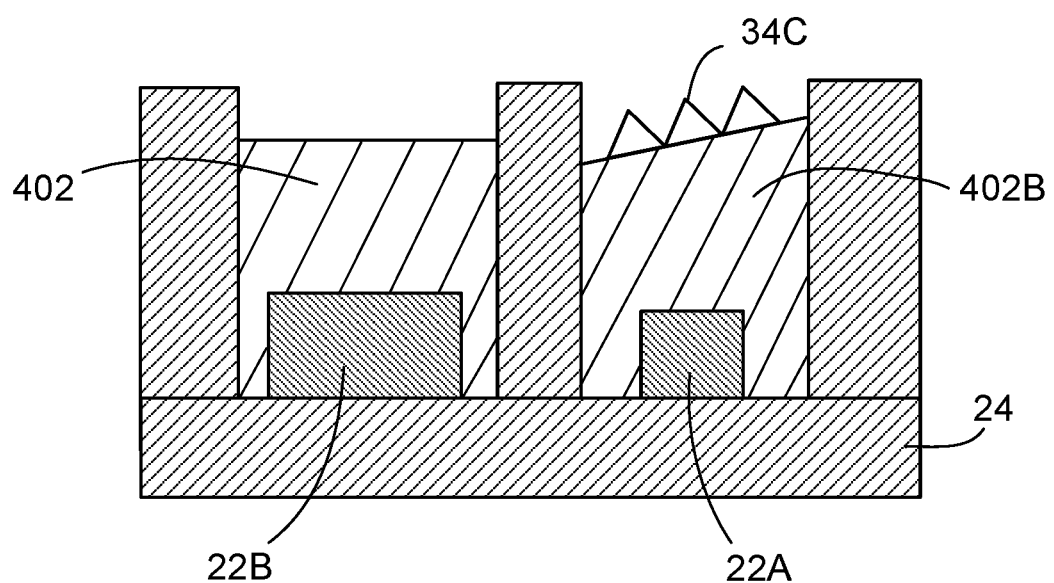

In the illustrated example of FIG. 17G the dicing lines 126 are located such that each module includes a pair of side-by-side optoelectronic devices 22 separated by a non-transparent wall 206A. Thus, the resulting modules can include multiple optical channels separated from one another by a non-transparent wall composed of the same material as the module's outer sidewalls. In some implementations, one of the optoelectronic devices 22A in the pair can be a light emitting element, whereas the second of the optoelectronic devices 22B can be a light detecting element. Examples of such modules are illustrated in FIGS. 18A and 18B. Furthermore, a first type of passive optical element may be disposed over one of the optoelectronic devices, and a different type of passive optical element (or no passive optical element) can be disposed over the other optoelectronic device. Examples of such modules are illustrated in FIGS. 18A and 18B. Other multi-channel modules having different combinations of optoelectronic devices, overmold regions and passive optical elements can be provided as well. Such modules can be fabricated using wafer-level techniques as described above. The areas of the tools 504 (see FIG. 17B) and 504A (see FIG. 17E) that define, respectively, the spaces 508 for the vacuum injected overmold regions 510 and the features 202A for the replicated passive optical elements 204A can be modified appropriately.

In some implementations, each module may contain, for example, only a single optoelectronic devices 22 (i.e., a single optical channel) as shown in FIGS. 16A-16C. It also is possible to provide each module with a two-dimensional M×N array of optoelectronic devices 22, where both M and N are two or more. When the module subsequently is mounted, for example, on a printed circuit board of a host device, underfill material can be provided, if desired, to protect the solder balls 38.

As used in this disclosure, the terms "transparent" and non-transparent" are made with reference to wavelength(s) of light in the visible and/or non-visible portions (e.g., infra-red) of the spectrum emitted by or detectable by the light emitting or light detecting elements in the optoelectronic device. Thus, for example, if a particular feature of the module is non-transparent, the feature is substantially non-transparent to the particular wavelength(s) of light emitted by or detectable by the light emitting or light detecting elements in the optoelectronic device. The particular feature may, however, be transparent or partially transparent with respect to other wavelengths.

The modules described here can be used in a wide range of applications, including, for example, ambient light sensors, proximity sensors, flash modules and image sensors, as well as others.

Various modifications can be made to the foregoing examples. Accordingly, other implementations are within the scope of the claims.

What is claimed is:

1. An optoelectronic module comprising:
an optoelectronic device embedded in a semiconductor substrate mounted on a printed circuit board;
outer sidewalls of the optoelectronic module laterally surrounding the semiconductor substrate and in direct contact with sides of the semiconductor substrate and the printed circuit board, wherein the outer sidewalls of the optoelectronic module are composed of a material that is non-transparent to light emitted by or detectable by the optoelectronic device;
a cover glass disposed directly on the semiconductor substrate including the optoelectronic device and in direct contact with the semiconductor substrate: and
a module cover disposed over the cover glass, and including a lens or diffuser on a surface of a transparent section of the module cover, wherein
the outer sidewalls of the optoelectronic module serve as a spacer that contacts a surface of the printed circuit board on which the semiconductor substrate is mounted and that also contacts an opposing surface of the module cover, wherein the opposing surface of the module cover faces towards the printed circuit board on which the semiconductor substrate is mounted, and wherein the non-transparent material of the outer sidewalls of the optoelectronic module is overmolded directly onto a top surface of the cover glass and near edges of the cover glass.

2. The optoelectronic module of claim 1, wherein the outer sidewalls of the optoelectronic module are composed of a vacuum injected material.

3. The optoelectronic module of claim 1, wherein the outer sidewalls of the optoelectronic module are composed of a UV or thermally-cured polymer material containing a non-transparent filler material.

4. The optoelectronic module of claim 1, wherein the optoelectronic device includes:
a light detecting element.

5. The optoelectronic module of claim 1, further including an adhesive underfill between the semiconductor substrate and the printed circuit board on which it is mounted.

* * * * *